US008608323B2

(12) United States Patent
Muller

(10) Patent No.: US 8,608,323 B2
(45) Date of Patent: Dec. 17, 2013

(54) BARRIER LAYER AND A METHOD OF MANUFACTURING THE BARRIER LAYER

(75) Inventor: Joost Muller, New Delhi (IN)

(73) Assignee: Moser Baer India Limited, New Delhi (IN)

( * ) Notice: Subject to any disclaimer, the term of this patent is extended or adjusted under 35 U.S.C. 154(b) by 91 days.

(21) Appl. No.: 13/425,544

(22) Filed: Mar. 21, 2012

(65) Prior Publication Data

US 2012/0243092 A1 Sep. 27, 2012

(51) Int. Cl.
*G02B 7/00* (2006.01)

(52) U.S. Cl.
USPC ............................ 359/507; 359/512; 257/729

(58) Field of Classification Search
USPC .......... 359/507, 511–513; 257/678, 687, 701, 257/729
See application file for complete search history.

(56) References Cited

U.S. PATENT DOCUMENTS

| | | | | | |
|---|---|---|---|---|---|
| 6,111,306 | A * | 8/2000 | Kawahara et al. | ............ | 257/666 |
| 6,259,204 | B1 * | 7/2001 | Ebisawa et al. | ............... | 313/512 |
| 6,849,877 | B2 * | 2/2005 | Yamazaki et al. | .............. | 257/86 |
| 6,933,617 | B2 * | 8/2005 | Pierce | .......................... | 257/786 |
| 8,324,727 | B2 * | 12/2012 | Fjelstad et al. | ................ | 257/723 |
| 2002/0094604 | A1 * | 7/2002 | Hayama et al. | ............... | 438/108 |
| 2004/0188814 | A1 * | 9/2004 | Houle et al. | .................. | 257/678 |
| 2009/0231714 | A1 * | 9/2009 | Zhao et al. | .................... | 359/601 |
| 2010/0195204 | A1 * | 8/2010 | Walker | .......................... | 359/507 |
| 2012/0113512 | A1 * | 5/2012 | Tsanev et al. | ................ | 359/507 |

* cited by examiner

*Primary Examiner* — Frank Font
(74) *Attorney, Agent, or Firm* — Antonio Papageorgiou; Ostrow Kaufman LLP

(57) ABSTRACT

A barrier layer capable of preventing permeability of moisture, oxygen, other gases, solvents and volatile organic compounds is provided. The barrier layer includes a surface profile undulating in all directions. Further, the surface profile is characterized by the absence of non-undulating surface, straight lines and sharp edges. Further, the surface profile bends in reaction to at least one of thermal stress, mechanical stress, and load caused by deformation of an adjoining substrate or layer. This allows the barrier layer to stretch and shrink in all directions in a plane along the surface profile of the barrier layer and prevents cracking of the barrier layer.

20 Claims, 7 Drawing Sheets

BARRIER LAYER AND A METHOD OF MANUFACTURING THE BARRIER LAYER

INCORPORATION BY REFERENCE OF PRIORITY DOCUMENT

This application is based on, and claims the benefit of priority from Indian Patent Application No. 824/DEL/2011 entitled "A BARRIER LAYER AND A METHOD OF MANUFACTURING THE BARRIER LAYER" which was filed on Mar. 24, 2011. The content of the aforementioned application is incorporated by reference herein.

FIELD OF INVENTION

The invention disclosed herein relates, in general, to a barrier layer and a method of manufacturing the barrier layer. More specifically, the present invention relates to a barrier layer with improved barrier properties.

BACKGROUND

Many electronic devices are sensitive to environmental gases and liquids and are prone to degradation on permeation of the environmental gases and liquids such as oxygen and water vapor. Further, chemicals used in manufacturing and processing of the electronic devices can be harmful to the electronic devices. In order to prevent against this degradation, the electronic devices are usually encapsulated by one or more layers which act as a barrier to harmful gases, liquids and chemicals. Conventionally, the one or more layers used include a flat alternating stack of plastic and inorganic layers. The alternating stack of plastic and inorganic layers prevents the harmful gases, liquids and chemicals from reaching the electronic devices.

However, the barrier layers such as the alternating plastic and inorganic layers being used currently have several disadvantages. For example, the inorganic layers have a much higher e-modulus than the plastic layers. Therefore, on application of mechanical load, the alternating plastic and inorganic layers are stretched and all tension forces are localized on thin inorganic layers, resulting in the thin inorganic layers absorbing much more stress than the plastic layers. Also, the plastic layers and the inorganic layers have different thermal expansion coefficients. Hence, on temperature variations the plastic layers and the inorganic layers behave differently resulting in build up of stress. The thin inorganic layers are not able to withstand the stress and crack thereby resulting in loss of barrier properties.

Hence, techniques have been developed to relieve stress on the inorganic layers. For example, U.S. Pat. No. 6,849,877 provides soft layers between and on top of one or more inorganic layers. According to the invention disclosed in U.S. Pat. No. 6,849,877, stress relief is provided by fracture of a first inorganic layer. Thereafter, the soft layers between the one or more inorganic layers prevent further crack growth into a second inorganic layer. However, the soft layers have no influence on the core problem of fracture proneness of individual inorganic layers under stress.

Additionally, deformation of a substrate adjoining the barrier layers will result in immediate tension or compression and load on the inorganic layers which might cause the barrier layers to fracture and leak.

In light of the foregoing discussion, there is a need for an improved barrier layer that prevents permeability of water, oxygen, harmful gases, liquids and chemicals, and can also withstand mechanical stress, thermal stress and load caused due to deformation of the substrate.

SUMMARY

The instant exemplary embodiments provide a barrier layer capable of preventing permeability of moisture, oxygen, other gases, solvents and volatile organic compounds.

Some embodiments provide a barrier layer which can withstand thermal stress, mechanical stress, and load caused by deformation of an adjoining substrate.

Some embodiments provide a barrier layer that does not crack upon stress and thereby provides improved barrier properties.

In some embodiments, the invention provides a barrier layer capable of preventing permeation of moisture, oxygen, other gases, solvents and volatile organic compounds into electronic devices. Also, the barrier layer includes a surface profile that has microscopic undulations in all directions in a plane along the surface profile. These microscopic undulations enable the surface profile to bend in all directions in reaction to at least one of thermal stress, mechanical stress, and load caused by deformation of an adjoining substrate or layer. This bending of the surface profile allows the barrier layer to stretch and shrink on a macroscopic level in all directions in the plane along the surface profile. The bending of the surface profile causes a reduction of stress build up on the barrier layer and thereby prevents cracking of the barrier layer.

In some embodiments, a barrier layer capable of preventing permeation of moisture, oxygen, other gases, solvents and volatile organic compounds is provided. The barrier layer has a surface profile that is characterized by absence of non-undulating surface, sharp edges and straight lines. Further, the surface profile bends in reaction to at least one of thermal stress, mechanical stress, and load caused by deformation of an adjoining substrate or layer. This bending of the surface profile allows the barrier layer to stretch and shrink in all directions in a plane along the surface profile of the barrier layer and prevents cracking of the barrier layer.

In some embodiments, material for the barrier layer is selected from a metal, a semiconductor, a metal oxide, a semiconductor-oxide, a metal fluoride, a metal nitride, a semiconductor-nitride, a metal carbide, a semiconductor carbide, a metal carbonitride, a semiconductor carbonitride, a metal oxynitride, a semiconductor oxynitride, a metal boride, a semiconductor boride, a metal oxyboride, a semiconductor oxyboride and combinations thereof.

In some embodiments, an electronic device like an organic light emitting diode (OLED) or a thin film photovoltaic device or an organic photovoltaic device is also provided, such that the electronic device includes the barrier layer.

In some embodiments, the barrier layer can be used as a light extraction layer in an organic light emitting diode (OLED).

In some embodiments, the barrier layer can be used as a light trapping layer in one of a thin film photovoltaic device and an organic photovoltaic device.

In some embodiments, thickness of the barrier layer ranges from 5 nm to 500 nm.

In some embodiments, the first set of predefined undulations and the second set of predefined undulations are produced using a process selected from engraving, milling, spontaneous buckling, interference lithography and other lithographic methods.

In some embodiments, the barrier layer is applied on the adjoining substrate or layer using a process selected from sputtering, evaporation, chemical vapor deposition, plasma enhanced chemical vapor deposition, sublimation, electron cyclotron resonance-plasma enhanced chemical vapor deposition, physical vapor deposition, atomic layer deposition, and combinations thereof.

In some embodiments, the surface profile of the barrier layer is defined by at least a first set of predefined undulations in a first direction along said surface profile and a second set of predefined undulations in a second direction along said surface profile.

In some embodiments, the first direction and the second direction are mutually perpendicular.

In some embodiments, the first set of predefined undulations are defined in terms of a first sinusoidal profile and the second set of predefined undulations are defined in terms of a second sinusoidal profile.

In some embodiments, a wavelength of the first sinusoidal profile and the second sinusoidal profile ranges from 80 nm to 80 micrometers and a wave height ranges from 10 nm to 80 micrometers.

In some embodiments, at least one of the first sinusoidal profile and the second sinusoidal profile is represented by the equation $z=A \sin x+B \sin y$, wherein 'A' and 'B' are unequal and 'x' and 'y' are x and y co-ordinates on xy plane of the surface profile respectively.

BRIEF DESCRIPTION OF FIGURES

The features of the present invention, which are believed to be novel, are set forth with particularity in the appended claims. The invention may best be understood by reference to the following description, taken in conjunction with the accompanying drawings. These drawings and the associated description are provided to illustrate some embodiments of the invention, and not to limit the scope of the invention.

Figure 1:
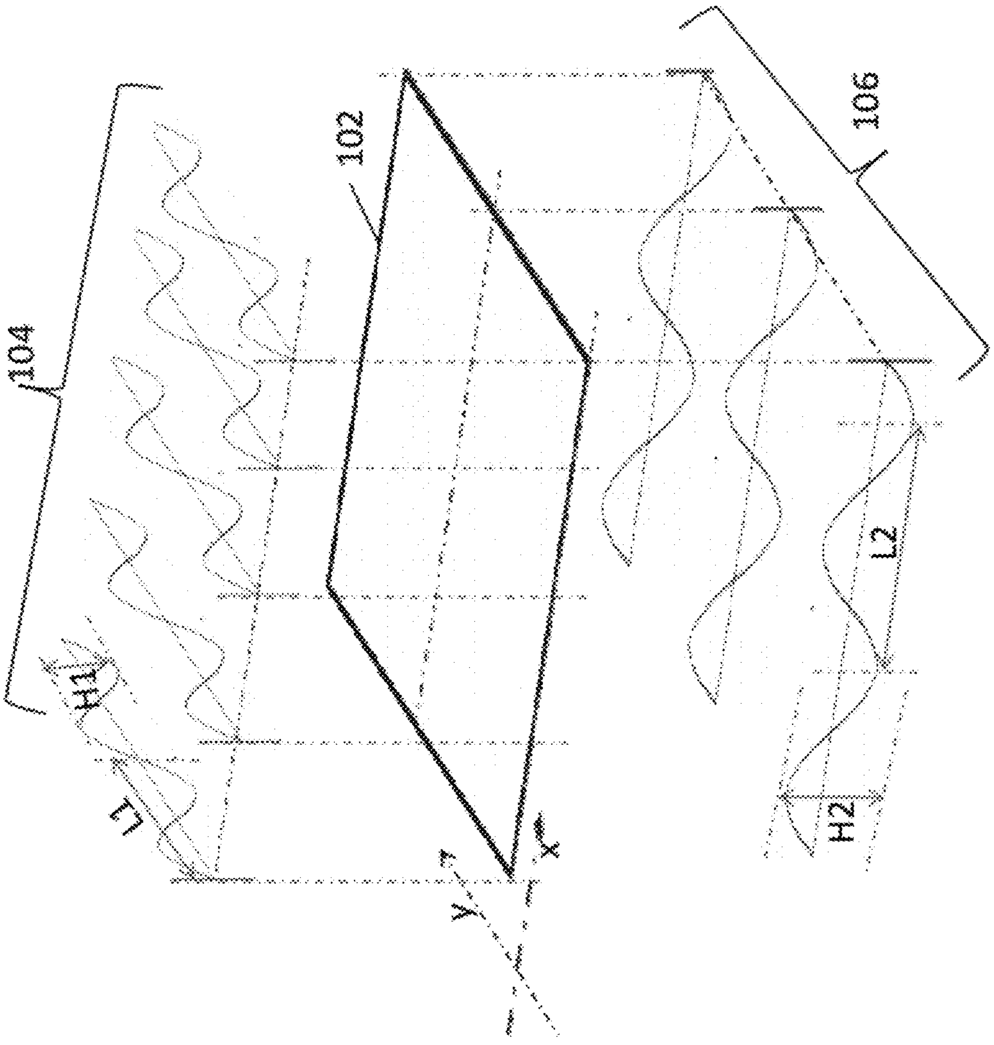
FIG. 1 is a diagrammatic illustration of an exemplary barrier layer and projections of a first set of predefined undulations and a second set of predefined undulations, in accordance with an exemplary embodiment of the present invention.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the present invention.

There may be additional structures described in the foregoing application that are not depicted on one of the described drawings. In the event such a structure is described, but not depicted in a drawing, the absence of such a drawing should not be considered as an omission of such design from the specification.

DESCRIPTION OF THE EXEMPLARY EMBODIMENTS

Before describing the present invention in detail, it should be observed that the present invention utilizes a combination of apparatus components related to a barrier layer and method steps related to manufacturing of the barrier layer. Accordingly the apparatus components and the method steps have been represented where appropriate by conventional symbols in the drawings, showing only specific details that are pertinent for an understanding of the present invention so as not to obscure the disclosure with details that will be readily apparent to those with ordinary skill in the art having the benefit of the description herein.

While the specification concludes with the claims defining the features of the invention that are regarded as novel, it is believed that the invention will be better understood from a consideration of the following description in conjunction with the drawings, in which like reference numerals are carried forward.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

The terms "a" or "an", as used herein, are defined as one or more than one. The term "another", as used herein, is defined as at least a second or more. The terms "including" and/or "having" as used herein, are defined as comprising (i.e. open transition). The term "coupled" or "operatively coupled" as used herein, is defined as connected, although not necessarily directly, and not necessarily mechanically.

Referring now to the drawings, FIG. 1 is a diagrammatic illustration of a barrier layer 102. In real life applications, for example, the barrier layer 102 can be deposited on a layer or a substrate of an electronic device. Examples of the electronic device include but are not limited to Organic Light Emitting Devices (OLEDs), thin film photovoltaic cells, organic photovoltaic cells, Liquid Crystalline Displays (LCDs) and the like. It should be appreciated that the barrier layer 102 can also be used on products other than electronic devices, like any product that needs protection against permeation of external fluids or gases. For example, in food packaging industry, the barrier layer 102 may be used to coat the inside of a plastic bottle, thereby improving the effectiveness of the plastic bottle against gas-permeation.

The barrier layer 102 is impermeable to environmental fluids like water vapor, oxygen and other gases. Further, the barrier layer 102 is also impermeable to fluids or solvents, such as volatile organic compounds like photoinitiator remains, non-reacted resins, side-reaction products or impurities released during processing of the electronic devices. The barrier layer 102 is also impermeable to contaminants that originate from the layer or the substrate on which the barrier layer 102 has been deposited. Use of the barrier layer 102 is important because it prevents contamination of other deposited layers in the electronic devices, such as semiconductor layers from contaminants present in the ambient medium and contaminants originating from other layers.

Examples of a material that can be used as the barrier layer 102 include, but are not limited to a metal, a semiconductor, a metal oxide, a semiconductor oxide, a metal fluoride, a semiconductor fluoride, a metal nitride, a semiconductor nitride, a metal carbide, a semiconductor carbide, a metal carbonitride, a semiconductor carbonitride, a metal oxynitride, a semiconductor oxynitride, a metal boride, a semiconductor boride, a metal oxyboride, a semiconductor oxyboride and combinations thereof.

The barrier layer 102 has a surface profile, wherein the surface profile includes a first set of predefined undulations 104 in a first direction along the surface profile and a second set of predefined undulations 106 in a second direction along the surface profile. The projections of the first set of predefined undulations 104 in the first direction and the second set of predefined undulations 106 in the second direction can be seen in FIG. 1. In real life applications, the first direction and the second direction can be mutually perpendicular to each other. For example, the first direction is along the y-axis of the surface profile and the second direction is along the x-axis of the surface profile. However, it should be appreciated that the first direction and the second direction can also be along other axes of the surface profile. For example, in real life applications, if the barrier layer 102, when viewed from the top, is rectangular in shape, then first direction can be along a length of the rectangular surface and the second direction can be along the breadth of the rectangular surface.

In this exemplary embodiment, the surface profile of the barrier layer 102 has been shown to include a first set of predefined undulations 104 in a first direction along the surface profile and a second set of predefined undulations 106 in a second direction along the surface profile. However, it should be appreciated that the surface profile of the barrier layer can be defined in the form of any surface that is characterized by absence of non-undulating surface, straight lines and sharp edges. Further the exemplary scenario used for description purposes here is not intended to be limiting but rather to provide an understandable description of the invention.

The first set of predefined undulations 104 are defined in terms of a first sinusoidal profile and the second set of predefined undulations 106 are defined in terms of a second sinusoidal profile. According to an embodiment, at least one of the first sinusoidal profile and the second sinusoidal profile is represented by the equation $z=A \sin x+B \sin y$. 'A' and 'B' in the equation are unequal to each other and 'x' and 'y' are x and y co-ordinates on xy plane of the surface profile or the plane of the barrier layer 102, respectively.

In an embodiment, a wavelength L1 of the first sinusoidal profile and a wavelength L2 of the second sinusoidal profile can range from 80 nm to 80 micrometers and a wave height H1 of the first sinusoidal profile and a wave height H2 of the second sinusoidal profile can range from 10 nm to 80 micrometers. Also, thickness of the barrier layer 102 can range from 5 nm to 500 nm. For example, in an embodiment, the barrier layer 102 can have a thickness of 200 nm, a wave-height in each of the two perpendicular directions of 500 nm and a wavelength in each of the two perpendicular directions of 1000 nm. The surface profile is defined by the sum of the first sinusoidal profile and the second sinusoidal profile, wherein amplitudes of the first sinusoidal profile and the second sinusoidal profile are considerably different to prevent occurrence of straight lines or flat surfaces in the surface profile.

The first set of predefined undulations 104 and the second set of predefined undulations 106 have been defined in terms of the first sinusoidal profile and the second sinusoidal profile respectively. However, it will be readily apparent to those ordinarily skilled in the art that the first set of predefined undulations 104 and the second set of predefined undulations 106 may be defined in terms of any other waveform, which makes the surface profile of the barrier layer 102 free of non-undulating features, straight lines or sharp edges, to achieve similar objectives without deviating from the scope of the invention.

Figure 2:
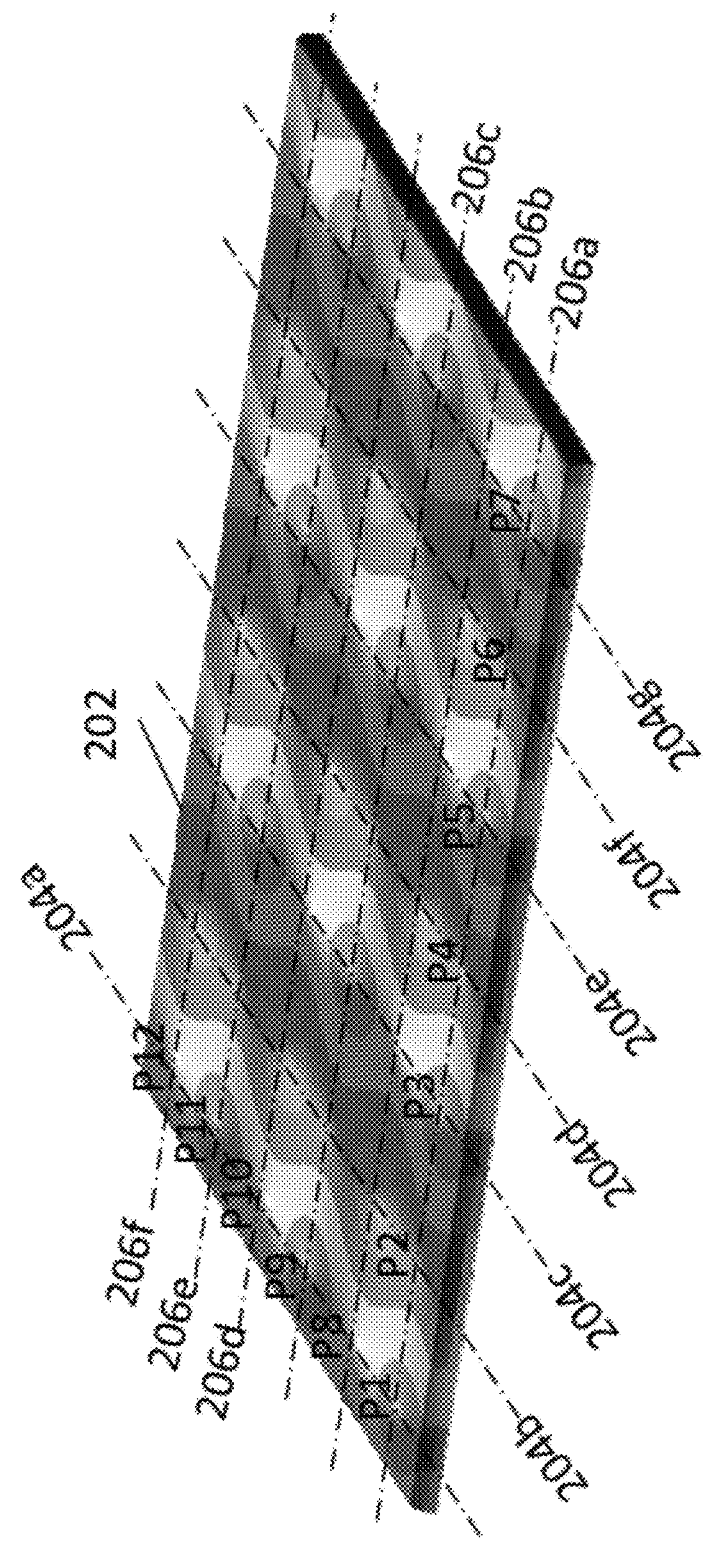
FIG. 2 is a diagrammatic illustration of an exemplary first set of predefined undulations and an exemplary second set of predefined undulations on a barrier layer, in accordance with another exemplary embodiment of the present invention.

FIG. 2 is a diagrammatic illustration of an exemplary first set of predefined undulations and an exemplary second set of predefined undulations on the barrier layer 202. In this exemplary embodiment, the first set of predefined undulations and the second set of predefined undulations have been shown to have a sinusoidal profile. However, it will be readily apparent to those ordinarily skilled in the art that the first set of predefined undulations and the second set of predefined undulations may be defined in terms of any other waveform, which makes the surface profile of the barrier layer 202 free of non-undulating features, straight lines or sharp edges. Further, the surface profile in this embodiment is shown to include undulations in only two different directions. However, it will be readily apparent to those ordinarily skilled in the art that the undulations may be present in more than two directions, such that the surface profile of the barrier layer 202 is free of non-undulating features. FIG. 2 and the associated description have been provided to illustrate some embodiments of the invention, and not to limit the scope of the invention.

There is shown in FIG. 2, a first set of predefined undulations 204*a*, 204*b*, 204*c*, 204*d*, 204*e*, 204*f* and 204*g* and a second set of predefined undulations 206*a*, 206*b*, 206*c*, 206*d*, 206*e* and 206*f* on a barrier layer 202. It should be appreciated that the barrier layer 202 is similar in characteristics to the barrier layer 102 described in conjunction with FIG. 1. Similarly, projections of the first set of predefined undulations 204*a*, 204*b*, 204*c*, 204*d*, 204*e*, 204*f* and 204*g* and the second set of predefined undulations 206*a*, 206*b*, 206*c*, 206*d*, 206*e* and 206*f* are similar in characteristics to the projections of the first set of predefined undulations 104 and the second set of predefined undulations 106 respectively described in conjunction with FIG. 1. Hence, similar to FIG. 1, the first set of predefined undulations 204*a*, 204*b*, 204*c*, 204*d*, 204*e*, 204*f* and 204*g* are also defined in terms of the first sinusoidal profile and the second set of predefined undulations 206*a*, 206*b*, 206*c*, 206*d*, 206*e* and 206*f* are defined in terms of the second sinusoidal profile.

The first set of predefined undulations 204*a*, 204*b*, 204*c*, 204*d*, 204*e*, 204*f* and 204*g* and the second set of predefined undulations 206*a*, 206*b*, 206*c*, 206*d*, 206*e* and 206*f* will be described in greater detail using the predefined undulation 204*a* and the predefined undulation 206*a*, respectively. Points P1, P2, P3, P4, P5, P6 and P7 describe a curvature of the second sinusoidal profile of the predefined undulation 206*a* and points P1, P8, P9, P10, P11 and P12 describe the curvature of the first sinusoidal profile of the predefined undulation 204*a*. In this exemplary embodiment, the first set of predefined undulations and the second set of predefined undulations have been shown to have a specific number of waves. The exemplary scenario used here is for description purposes and is not intended to be limiting but rather to provide an understandable description of the invention. Therefore, it will be readily apparent to those ordinarily skilled in the art that number of waves present may be greater or lesser than those shown. For example in an embodiment, the number of waves in the first direction and the second direction may be in the order of several hundred to several thousands. For example, in real life applications, a barrier layer having a size of 15 cm×15 cm can include waves having a wavelength of 1 micron.

In the predefined undulation 206*a*, the points P1, P3, P5 and P7 are crests and points P2, P4 and P6 are troughs of the second sinusoidal profile. Other undulations 206*b*, 206*c*, 206*d*, 206*e* and 206*f* in the second set of predefined undulations also have similar crests and troughs.

In the predefined undulation 204*a*, the points P1, P9, and P11 are crests and points P8, P10 and P12 are troughs of the first sinusoidal profile. Other undulations 204*b*, 204*c*, 204*d*, 204*e*, 204*f* and 204*g* in the first set of predefined undulations also have similar crests and troughs.

The first sinusoidal profile of the first set of predefined undulations 204*a*, 204*b*, 204*c*, 204*d*, 204*e*, 204*f* and 204*g* and the second sinusoidal profile of the second set of predefined undulations 206*a*, 206*b*, 206*c*, 206*d*, 206*e* and 206*f* characterize the surface profile in such a way that the surface profile does not have any non-undulating surface, i.e., the surface profile of the barrier layer 202 is characterized by absence of straight lines and sharp edges. The absence of non-undulating surface, i.e., straight lines or sharp edges, eliminates or minimizes points or regions that can facilitate a build-up of concentrated stress in the barrier layer 202. This further helps prevent breakage of the barrier layer 202 or the electronic device on which the barrier layer 202 is applied. For example, if the surface profile of the barrier layer 202 includes non-undulating surfaces like cones and pyramids, which are characterized by straight lines and sharp edges, there will be an increase in points and regions that facilitate build-up of stress. Thereby, leading to breakage and fracture of the barrier layer 202.

The first set of predefined undulations 204*a*, 204*b*, 204*c*, 204*d*, 204*e*, 204*f* and 204*g* and the second set of predefined undulations 206*a*, 206*b*, 206*c*, 206*d*, 206*e* and 206*f* on the barrier layer 202 provide a wavy structure to the barrier layer 202 in two directions, i.e the first direction and the second direction. This allows the barrier layer 202 of the present invention to bend in all directions in a plane along the surface of the barrier layer in reaction to at least one of thermal stress, mechanical stress, and load caused by deformation of an adjoining substrate or layer, thereby reducing build up of the stress or the load and preventing the barrier layer 202 from fracturing or cracking. The stress or the load can be a result of an outside force. The stress or the load can also be caused due to temperature variation in combination with different thermal expansion coefficients of inorganic barrier layers and adjoining layers or substrate. Further, the stress or the load can also be caused due to deformation of the adjoining layers or substrate. Also, the stress or the load can be caused due to humidity absorption and resulting expansion of the adjoining layers or substrate.

In real life applications, the surface profile includes microscopic undulations in all directions in the plane along the surface profile. These microscopic undulations enable the surface profile to bend in all directions in reaction to at least one of thermal stress, mechanical stress, and load caused by deformation of an adjoining substrate or layer. This bending of the surface profile allows the barrier layer to stretch and shrink on a macroscopic level in all directions in the plane along the surface profile, thereby preventing the barrier layer from cracking on application of stress and load.

The barrier layer 202 described, so far, includes a single layer. However, it should be appreciated that in real life applications, a multi-layer barrier layer, including an alternating stack of the barrier layer 202 and a layer of polymeric material, can also be used to achieve similar objectives as the barrier layer 202. Such multi-layer barrier layer may be formed by alternately depositing the barrier layer 202 and layer of polymeric material. Examples of the polymeric material can include, but is not limited to, acrylates, thiols, epoxies, polyesters, siloxanes, urethanes, or combinations thereof.

For ease in understanding of the invention, the description will make reference to the barrier layer 202. However, it will be readily apparent to those ordinarily skilled in the art that the multi-layer barrier layer can also be applied, without deviating from the scope of the invention.

In an embodiment, the barrier layer 202 can be used in an OLED. In OLEDs, both an emitting substrate side and a non-emitting back-side require protection from water and oxygen. Hence, the barrier layer 202 can be used on both the emitting substrate side and the non-emitting back-side for protection against water and oxygen permeation. For application in the OLEDs, the barrier layer 202 will have to be transparent and will usually be provided between a substrate and an OLED stack. In an embodiment, the barrier layer 202 can also be used as a light extraction layer in the OLEDs. Since the surface profile of the barrier layer 202 is undulating in nature it will increase the active surface of a light emitting organic material in the OLEDs which would in turn result in higher intensity per surface area.

Figure 3:
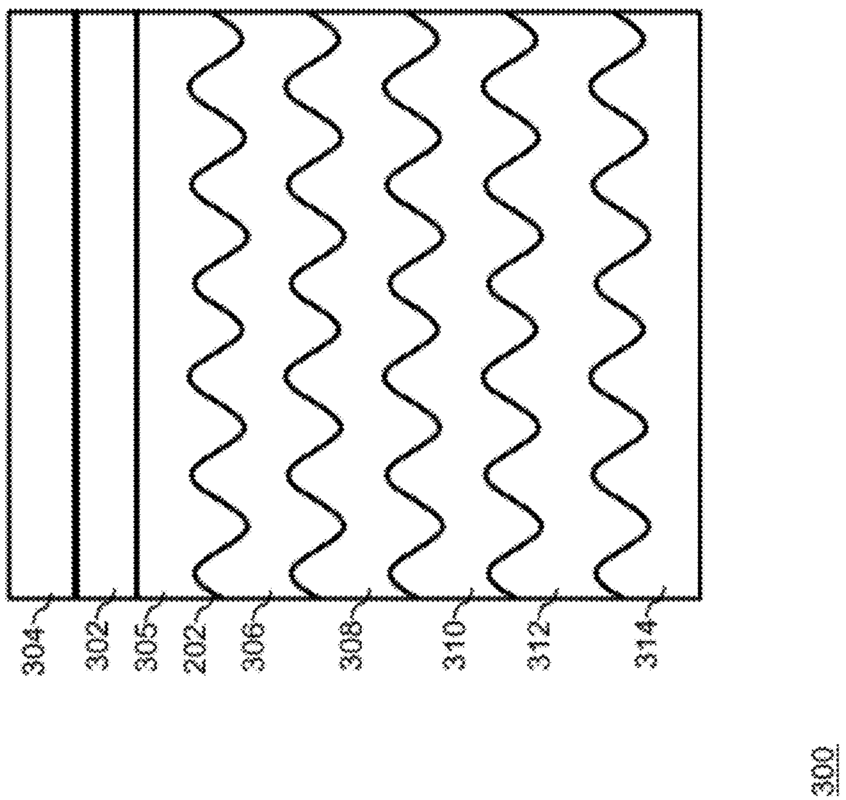
FIG. 3 is a diagrammatic illustration of various components of an exemplary OLED, in accordance with an embodiment of the present invention.

Referring now to FIG. 3, there is shown a stack of layers in an exemplary OLED 300, to illustrate the use of a barrier layer of the present invention in an OLED. The OLED 300 is shown to include the barrier layer 202. In some embodiments, the barrier layer 202 can also function as an internal light extraction layer.

Some real life examples of the OLED 300 can include, but are not limited to, Organic Light Emitting Diode (OLED), White Organic Light Emitting Diode (W-OLED), Active-matrix Organic Light Emitting Diodes (AMOLED), Passive-matrix Organic Light Emitting Diodes (PMOLED), Flexible Organic Light Emitting Diodes (FOLED), Stacked Organic Light Emitting Diodes (SOLED), Tandem Organic Light Emitting Diode, Transparent Organic Light Emitting Diodes (TOLED), Top Emitting Organic Light Emitting Diode, Bottom Emitting Organic Light Emitting Diode, Fluorescence doped Organic Light Emitting Diode (F-OLED) and Phosphorescent Organic Light Emitting Diode (PHOLED).

The OLED 300 also includes a transparent substrate 302, one or more light management layers like an external light extraction layer 304, and an internal light extraction layer 305, the barrier layer 202, a first electrode 306, one or more semiconductor layers 308 and 310, a second electrode 312 and a cover substrate 314. The cover substrate 314 can be applied on the second electrode 312 and encapsulates the barrier layer 202 internal light extraction layer 305, the first electrode 306, the one or more semiconductor layers 308 and 310 and the second electrode 312 between itself and the transparent substrate 302. For ease in understanding of the invention, each layer in the stack of layers in the OLED 300 is shown to have the same size. However, those ordinarily skilled in the art will appreciate that the elements in this figure have been illustrated for simplicity and clarity and are not necessarily drawn to scale. For example, the transparent substrate 302 and the cover substrate 314 can be of a size appropriately greater than other layers so as to be able to encapsulate the OLED 300.

The transparent substrate 302 provides strength to the OLED 300, and also acts as an emissive surface of the OLED 300 when in use. The examples of the transparent substrate 302 include, but are not limited to, glass, flexible glass, polycarbonate, zeonor, polyethylene terephthalate (PET), polyethylene naphthalate (PEN), and other transparent or translucent material. The undulating surface profile according to the invention can be injection molded or replicated into the substrate.

The external light extraction layer 304 and the internal light extraction layer 305 can be layers of a curable material, and corresponding surface profiles can also be molded in the substrate itself. The curable material can include, but is not limited to, an ultra-violet curable material, a photo-polymer lacquer, an acrylate, and silica or silica-titania based sol-gel materials. In an embodiment, the external light extraction layer 304 may be replaced by a layer similar to the barrier layer 202.

The first electrode 306 and the second electrode 312 are used to apply a voltage across the one or more semiconductor layers 308 and 310. The first electrode 306 and the second electrode 312, can be implemented with, for example, transparent conductive oxide (TCO), such as indium tin oxide (ITO), Indium Zinc Oxide (IZO) or metals with appropriate work function to make injection of charge carriers such as calcium, aluminum, gold, or silver.

The one or more semiconductor layers 308 and 310 can be implemented with any organic electroluminescent material such as a light-emitting polymer, evaporated small molecule materials, light-emitting dendrimers or molecularly doped polymers.

The barrier layer 202 deposited on the substrate, can replace the internal light extraction layer 305. The undulating surface profile of the barrier layer 202 allows the barrier layer 202 to reduce total internal reflection (TIR) of the light emitted by the one or more semiconductor layer 308 and 310. The barrier layer 202 can facilitate a change in propagation direction of the light such that the light is transmitted through the barrier layer 202 instead of undergoing TIR.

In another embodiment, the barrier layer 202 may also be placed between the second electrode 312 and the cover substrate 314.

In another embodiment the barrier layer 202 can be used in a thin film photovoltaic cell or an organic photovoltaic cell. Similar to the OLEDs, the thin film or organic photovoltaic cells also require protection from water and oxygen on both the light entrance substrate side and the usually reflecting back-side. Additionally, the barrier layer 202 can also be used as a light trapping layer in the thin film photovoltaic device. Since the surface profile of the barrier layer 202 is undulating in nature, it helps in scattering and diffraction of light thereby enhancing the light path through the thin film photovoltaic device and also enhancing chances of absorption of the light by semiconductor layers of the thin film photovoltaic device.

Figure 4:
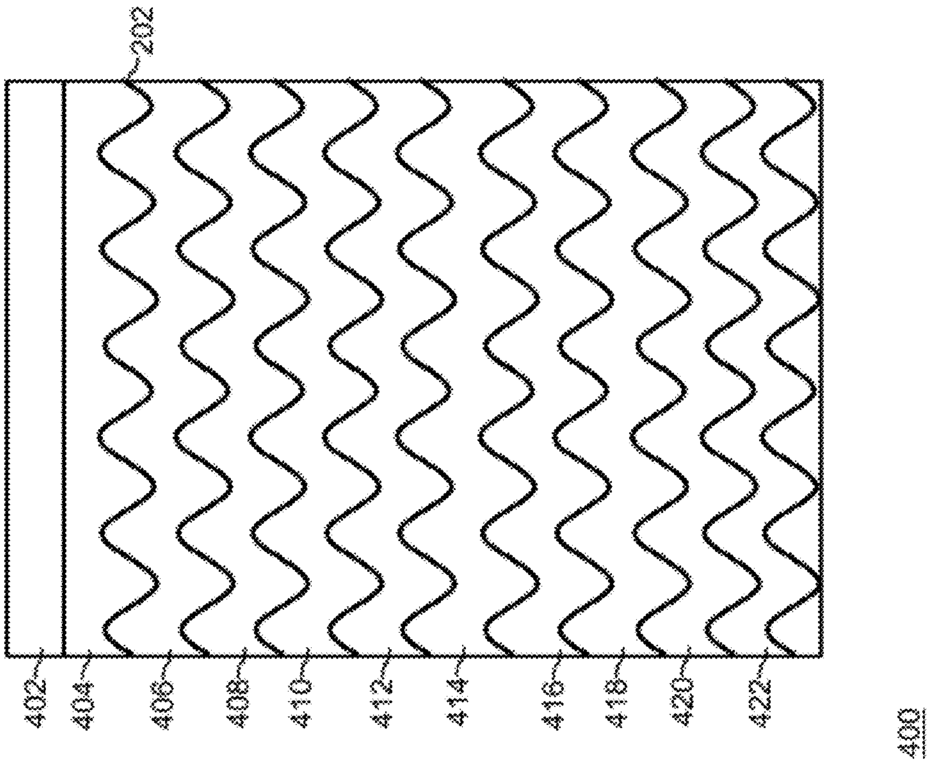
FIG. 4 is a diagrammatic illustration of various components of an exemplary photovoltaic device, in accordance with an embodiment of the present invention.

There is shown in FIG. 4, a diagrammatic illustration of various components of an exemplary photovoltaic device 400, to illustrate the use of a barrier layer of the present invention in a photovoltaic device. Examples of the photovoltaic device 400 include, but are not limited to, a thin film solar cell, an organic solar cell, an amorphous silicon solar cell, a microcrystalline silicon solar cell, a micromorph silicon tandem solar cell, a Copper Indium Gallium Selenide (CIGS) solar cell, a Cadmium Telluride (CdTe) solar cell, and the like. The photovoltaic device 400 is shown to include a stack of a substrate 402, a layer 404 of a viscous curable material, the barrier layer 202, a first layer 406 of TCO, multiple semiconductor layers 408, 410, 412, 414 and 416, a second layer 418 of TCO, a layer 420 of silver, and a layer 422 of aluminum.

The substrate 402 provides strength to the photovoltaic device 400 and is used as a starting point for deposition of other layers that constitute the photovoltaic device 400. An example of a material of the substrate 402 includes, but is not limited to, glass and transparent plastics. In some exemplary embodiments, during real life applications, the photovoltaic device 400 is placed in a way that the substrate 402 is facing the sun and all the sun light falling on the photovoltaic device 400 is incident on the substrate 402. In these embodiments, the substrate 402 is made of a transparent material so that it allows maximum light to pass through itself and reach the subsequent layers. The substrate 402 includes a flat surface on which other subsequent layers can be deposited. In an embodiment, the substrate 402 can also include the surface profile necessary for light trapping, making the viscous curable material unnecessary.

Moving on to the layer 404 of the viscous curable material, the layer 404 of the viscous curable material is deposited over the substrate 402. Examples of the viscous curable material can include, but is not limited to, an ultra-violet curable material, a photo-polymer lacquer, an acrylate, and silica or silica-titania based sol-gel materials.

In some embodiments, the viscous curable material is precured by using light and/or heat prior to depositing the layer 404 of the viscous curable material on the flat surface of the substrate 402. Pre-curing of the viscous curable material is performed in order to minimize the out-gassing of fluids or solvents from the viscous curable material during later stages of manufacturing of the photovoltaic device 400 or during actual usage of the photovoltaic device 400. These fluids or solvents coming out of the viscous curable material have a tendency to contaminate subsequent layers of the photovoltaic device 400 and thus, impact the overall performance of the photovoltaic device 400.

Moving on to the barrier layer 202, in some cases the barrier layer 202 is deposited on the layer 404 of the viscous curable material after the layer 404 of the viscous curable material has been deposited on the transparent substrate 402. The barrier layer 202 is impermeable to water, oxygen, the fluids or solvents, such as volatile organic compounds like photoinitiator remains, non-reacted resins, side-reaction products or impurities, which are released by the viscous curable material during manufacturing of the photovoltaic device 400 or during actual usage of the photovoltaic device 400. The barrier layer 202 prevents the detrimental effect of the water, oxygen, contaminants/elements, fluids or solvents released by the viscous curable material and/or the substrate 402, on other deposited layers, such as the first layer 406 of TCO, and the multiple semiconductor or organic layers 408, 410, 412, 414, and 416 or on an encapsulant of the photovoltaic device 400. Further, the barrier layer 202 also facilitates adhesion between the layer 404 of the viscous curable material and other deposited layers, such as the first layer 406 of TCO and the multiple semiconductor layers 408, 410, 412, 414, and 416.

Moving on to the first layer 406 of TCO, the first layer 406 of TCO is deposited over the barrier layer 202. TCOs are doped metal oxides used in photovoltaic devices. Examples of TCOs include, but are not limited to, Aluminum-doped Zinc Oxide (AZO), Indium Zinc Oxide (IZO), Boron doped Zinc Oxide (BZO), Gallium doped Zinc Oxide (GZO), Fluorine doped Tin Oxide (FTO) and Indium doped Tin Oxide (ITO). TCOs have more than 80% transmittance of incident light and have conductivities higher than $10^3$ S/cm for efficient carrier transport. The transmittance of TCOs, just as in any transparent material, is limited by light scattering at defects and grain boundaries.

Next set of layers in the stack of photovoltaic device 400 are the multiple semiconductor layers 408, 410, 412, 414, and 416. Generally, the multiple semiconductor layers 408, 410, 412, 414, and 416 are deposited using chemical vapour deposition, sputtering, and hot wire techniques on the first layer 406 of TCO. For the purpose of this description, the semiconductor layers are shown to include a first layer of p-doped semiconductor 408, a second layer of p-doped semiconductor 410, a layer of buffer 412, a layer of i-doped semiconductor 414, and a layer of n-doped semiconductor 416. However, it will be readily apparent to those skilled in the art that the photovoltaic device 400 can include or exclude one or more semiconductor or organic PV-layers without deviating from the scope of the invention.

For the purpose of this description, the first layer of p-doped semiconductor 408 is made of μc Si:H. However, the second layer of p-doped semiconductor 410, the layer of i-doped semiconductor 414, and the layer of n-doped semiconductor 416 are made of a Si:H.

In general, the semiconductor layers are deposited in a p-i-n sequence, i.e. p-doped semiconductor, i-doped semiconductor, and n-doped semiconductor. This is because the mobility of electrons in a Si:H is nearly twice than that of holes in a Si:H, and thus the collection rate of electrons moving from the p- to n-type contact is better as compared to holes moving from p- to n-type contact. Therefore, the p-doped semiconductor layer is placed at the top where the intensity of light is more.

Following the semiconductor layers, a cover substrate is deposited. In one embodiment, a cover substrate can encapsulate the second layer 418 of TCO, the layer 420 of silver, and the layer 422 of aluminum. These layers individually or in combination form the back contact of the photovoltaic device 400. In some cases, the photovoltaic device 400 may have additional layers to enhance their efficiency or to improve the reliability.

Figure 5:
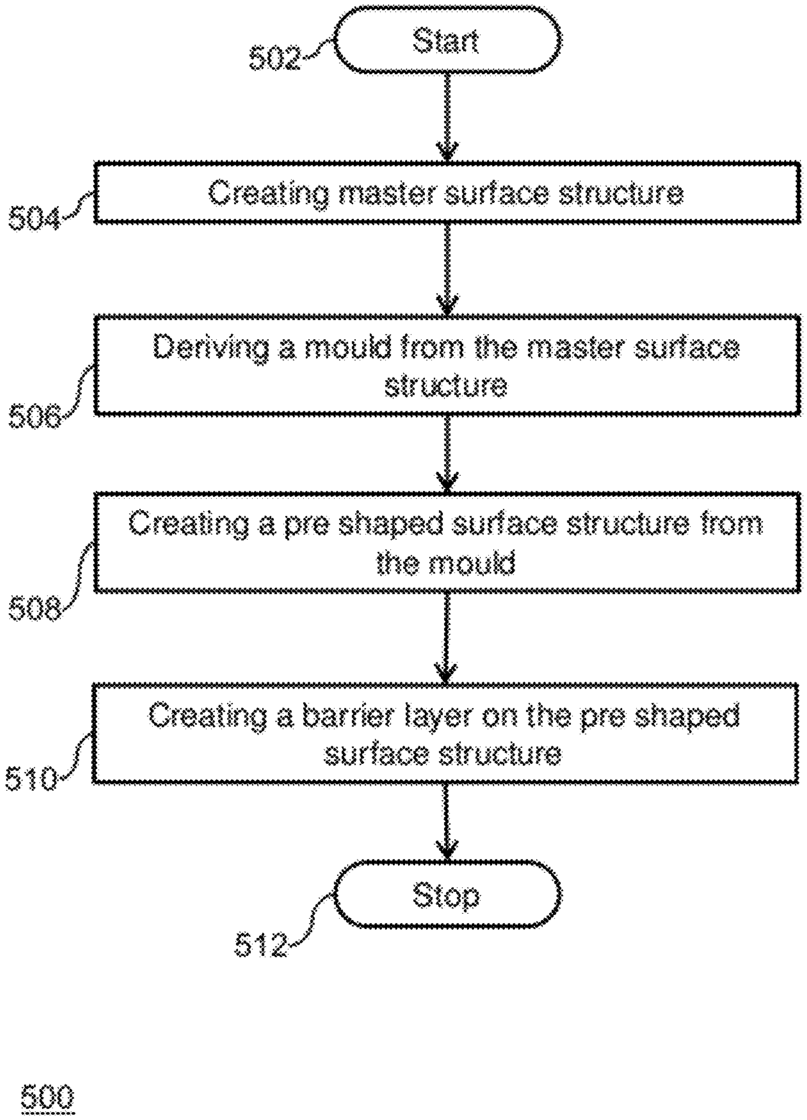
FIG. 5 is a flow chart describing a method of producing the first set of predefined undulations and the second set of predefined undulations in the barrier layer, in accordance with another exemplary embodiment of the present invention.

Moving on to FIG. 5, a flow chart describing an exemplary method 500 of producing the first set of predefined undulations 204*a*, 204*b*, 204*c*, 204*d*, 204*e*, 204*f* and 204*g* and the second set of predefined undulations 206*a*, 206*b*, 206*c*, 206*d*, 206*e* and 206*f* in the barrier layer 202, in accordance with an embodiment of the present invention, has been represented in FIG. 5. However, it will be readily apparent to those ordinarily skilled in the art that the barrier layer 202 can also be produced using other methods, without deviating from the scope of the invention.

For the purpose of this description, the method 500 is explained in conjunction with the barrier layer 202. However, it will be readily apparent to those ordinarily skilled in the art that the method 500 can also be applied, without deviating from the scope of the invention, for any barrier layers. Moreover, the invention is not limited to the order in which the steps are listed in the method 500. In addition, the method 500 can contain a greater or fewer numbers of steps than those shown in FIG. 5.

The method 500 is initiated at step 502. At step 504, a master surface structure is created. The master surface structure includes the first set of predefined undulations 204*a*, 204*b*, 204*c*, 204*d*, 204*e*, 204*f* and 204*g* in the first direction and the second set of predefined undulations 206*a*, 206*b*, 206*c*, 206*d*, 206*e* and 206*f* in the second direction. The master surface structure can be created using any process selected from engraving, milling, interference lithography, other lithographic methods and spontaneous buckling. Preferably, the master surface structure is created using interference lithography. In case of interference lithography, the material used for the master surface structure can include a photoresist material or any other light sensitive material. In interference lithography, an interference pattern between two coherent light waves is set up and recorded in the master surface structure. The interference pattern includes a periodic series of fringes representing the minima and maxima in the intensity of the coherent light waves. Thereafter, a pattern corresponding to the periodic series of fringes emerges on the master surface structure. The coherent light waves can be so selected that the pattern of fringes which emerges on the master surface structure is similar to the first set of predefined undulations 204*a*, 204*b*, 204*c*, 204*d*, 204*e*, 204*f* and 204*g* in the first direction and the second set of predefined undulations 206*a*, 206*b*, 206*c*, 206*d*, 206*e* and 206*f* in the second direction.

Thereafter, at step 506, a mould is derived from the master surface structure. Thereafter, at step 508, a pre shaped surface structure is developed using the mould. The pre shaped surface structure can be developed from the mould using any replication technique, like injection molding, photo-polymerization replication in lacquer, hot and cold embossing, photo-nano-imprint lithography, roll-to-roll or sheet-to-sheet replication.

Following this at step 510, a layer is deposited on the pre shaped surface structure. The pre shaped surface which includes the photoresist pattern produces the pattern of the first set of predefined undulations 204*a*, 204*b*, 204*c*, 204*d*, 204*e*, 204*f* and 204*g* in the first direction and the second set of predefined undulations 206*a*, 206*b*, 206*c*, 206*d*, 206*e* and 206*f* in the second direction on the layer deposited on the pre shaped surface structure. The layer deposited on the pre shaped surface structure is the barrier layer 202. Thereafter, the method 500 is terminated at step 512.

The barrier layer 202 can be applied on a preformed substrate or a preformed layer of the electronic devices using various methods. For example, the barrier layer may be applied on the preformed substrate by any one of sputtering, evaporation, chemical vapor deposition, plasma enhanced chemical vapor deposition, sublimation, electron cyclotron resonance-plasma enhanced chemical vapor deposition, physical vapor deposition, atomic layer deposition, and combinations thereof.

Figure 6:
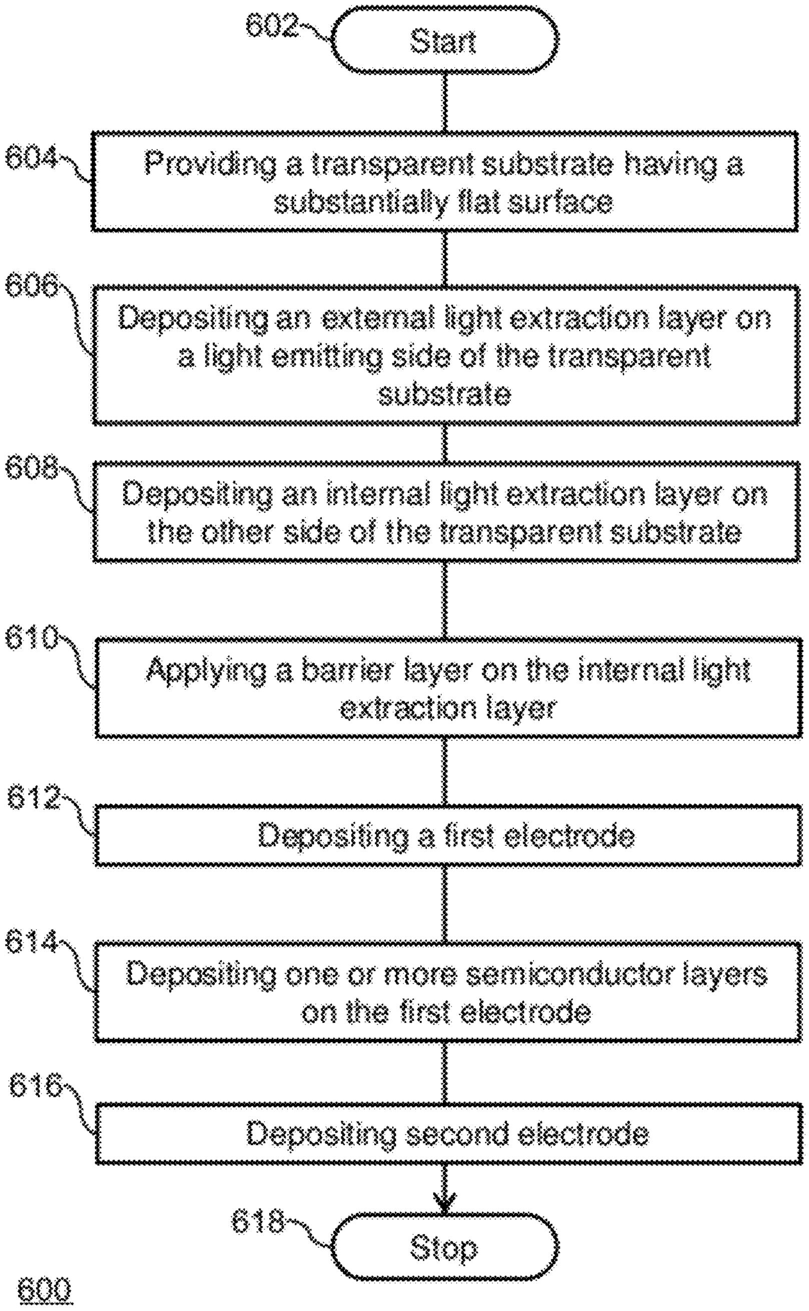
FIG. 6 is a flow chart describing an exemplary method of manufacturing an OLED, in accordance with an embodiment of the present invention.

Moving on to FIG. 6, FIG. 6 is a flow chart describing an exemplary method 600 for manufacturing the OLED 300 in accordance with an embodiment of the present invention. To describe the method 600, reference will be made to FIG. 3, although it is understood that the method 600 can be implemented to manufacture any other suitable device. Moreover, the invention is not limited to the order of in which the steps are listed in the method 600. In addition, the method 600 can contain a greater or fewer numbers of steps than those shown in FIG. 6.

The method 600 for manufacturing the OLED 300 is initiated at step 602. At step 604, the transparent substrate 302 is provided. Following this, at step 606, the external light extraction layer 304 is deposited on a light emitting side of the transparent substrate 302. The external light extraction layer 304 can be deposited by using a brush or roller, dispensing, slot dye coating, spin-coating, spray coating, diverse replication techniques, injection moulding or printing. In an embodiment, a layer similar to the barrier layer 202 can act as the external light extraction layer 304.

Following this, at step 608, the internal light extraction layer 305 is deposited on the other side of the transparent substrate 302. The internal light extraction layer 305 can be deposited by using a brush or roller, dispensing, slot dye coating, spin-coating, spray coating, diverse replication techniques, injection molding or printing. In an embodiment, the barrier layer 202 can act as the internal light extraction layer 305. Since the surface profile of the barrier layer 202 is undulating in nature it will increase the active surface of the transparent substrate 302, which would in turn result in higher intensity per surface area.

Thereafter, at step 610, the barrier layer 202 is applied on the internal light extraction layer 305. The barrier layer 202 may be applied by any one of sputtering, evaporation, chemical vapor deposition, plasma enhanced chemical vapor deposition, sublimation, electron cyclotron resonance-plasma enhanced chemical vapor deposition, physical vapor deposition, atomic layer deposition, and combinations thereof. It should be appreciated that the undulating surface profile of the barrier layer 202 is maintained even after deposition of other layers of the OLED 300.

At step 612, the first electrode 306 is deposited on the barrier layer 202. A material for the first electrode 306 can be any transparent conducting material, for example, a transparent conducting oxide (TCO) like Indium Tin Oxide (ITO) or Zinc Oxide. The first electrode 306 can be deposited by using various methods, such as dip coating, spin coating, doctored blade, spray coating, screen printing, sputtering, glass mastering, photoresist mastering, electroforming, and evaporation. In an embodiment, the first electrode 306 acts as an anode.

Thereafter, at step 614, the one or more semiconductor layers 308 and 310 are deposited on the first electrode 306. The one or more semiconductor layers 308 and 310 can be deposited by using various methods, such as dip coating, spin coating, doctored blade, spray coating, screen printing, sputtering, glass mastering, photoresist mastering, all kinds of CVD, electroforming, and evaporation.

Following this, at step 616, the second electrode 312 is deposited. A material for the second electrode 312 can be any conducting material, for example, a transparent conducting oxide (TCO) like Indium Tin Oxide (ITO) or Zinc Oxide, aluminum or silver with an electron injection layer. The second electrode 312 can be deposited by using various methods, such as dip coating, spin coating, doctored blade, spray coating, screen printing, sputtering, glass mastering, photoresist mastering, all kinds of CVD, electroforming, and evaporation. In an embodiment, the second electrode 312 acts as a cathode. In an embodiment, a cover substrate can also be deposited on the second electrode after the step 616. The cover substrate can encapsulate the, the first electrode 306, the one or more semiconductor layers 308 and 310, the second electrode 312 between itself and the barrier layer 202.

Thereafter the method 600 is terminated at step 618.

Figure 7:
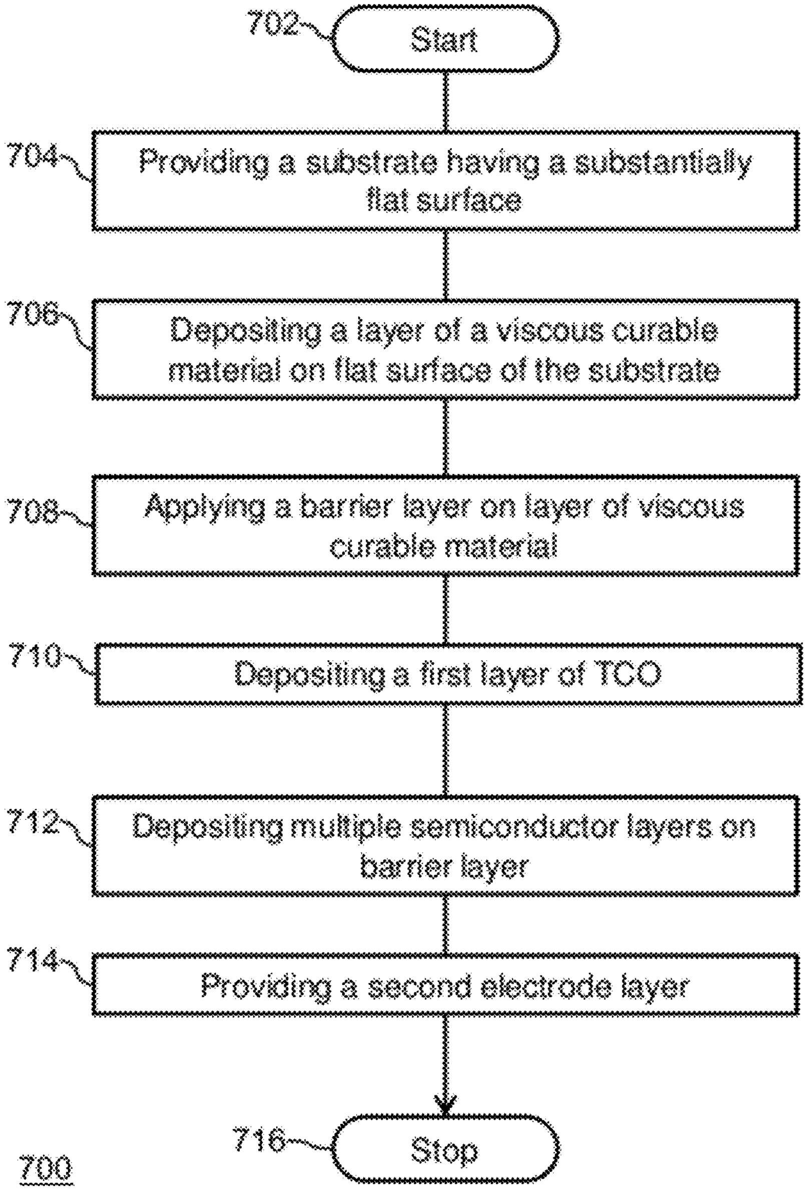
FIG. 7 is a flow chart describing an exemplary method of manufacturing a photovoltaic device, in accordance with an embodiment of the present invention.

Moving on to FIG. 7, FIG. 7 is a flow chart describing an exemplary method 700 for manufacturing the photovoltaic device 400 in accordance with an embodiment of the present invention. To describe the method 700, reference will be made to FIG. 4, although it is understood that the method 700 can be implemented to manufacture any other suitable device. Moreover, the invention is not limited to the order in which the steps are listed in the method 700. In addition, the method 700 can contain a greater or fewer numbers of steps than those shown in FIG. 7.

The method 700 for manufacturing the photovoltaic device 400 is initiated at step 702. At step 704, the substrate 402 is provided. Following this, at step 706, the layer 404 of the viscous curable material is deposited on the flat surface of the substrate 402. The viscous curable material can be deposited by using a brush or roller, dispensing, slot dye coating, spin-coating, spray coating, injection molding, replication technique to form the required surface profile from the invention or printing.

At step 708, the barrier layer 202 is applied on the layer 404 of the viscous curable material. The barrier layer 202 may be applied by any one of sputtering, evaporation, chemical vapor deposition, plasma enhanced chemical vapor deposition, sublimation, electron cyclotron resonance-plasma enhanced chemical vapor deposition, physical vapor deposition, atomic layer deposition, and combinations thereof. It should be appreciated that the undulating surface profile of the barrier layer 202 is maintained even after deposition of other layers of the photovoltaic device 400. The barrier layer 202 is impermeable to water, oxygen, the fluids or solvents released by the viscous curable material and the substrate 402 during later stages of manufacturing of the photovoltaic device 400 or during actual usage of the photovoltaic device 400. Thus, the barrier layer 202 prevents the detrimental effect of water, oxygen entering from outside and the fluids or solvents released by the viscous curable material and/or the substrate 402 on other deposited layers. Additionally the undulating surface profile of the barrier layer 202 enables and enhances light trapping capability of the semiconductor layers of the photovoltaic device 400. The surface profile helps in scattering and diffraction of the light and thus, enhances the light path through the photovoltaic device 400 and hence, enhances the chance of absorption of light by the semiconductor layers of the photovoltaic device 400.

Thereafter, at step 710, the first layer 406 of TCO is deposited over the barrier layer 202. The first layer 406 of TCO may be deposited by using various methods, such as dip coating, spin coating, doctored blade, spray coating, screen printing, sputtering, glass mastering, photoresist mastering, electroforming, all kinds of CVD, and evaporation. Thereafter, at step 712, multiple semiconductor layers are deposited on the first layer 406 of TCO. These multiple semiconductor layers can include the first layer of p-doped semiconductor 408, the second layer of p-doped semiconductor 410, the layer of buffer 412, the layer of i-doped semiconductor 414, and the layer of n-doped semiconductor 416. As described in conjunction with FIG. 4, the semiconductor layers are deposited in a manner that they form a p-i-n structure.

Following this, at step 714, the second layer 418 of TCO is deposited on the multiple semiconductor layers. In an embodiment, a cover substrate can be provided on the second layer 418 of TCO. The cover substrate can encapsulate the first layer 406 of TCO, the multiple semiconductor layers 408, 410, 412, 414 and 416, the second layer 418 of TCO between itself and the barrier layer 202. In another embodiment the layer 420 of silver, and the layer 422 of aluminum may also be deposited on the second layer 418 of TCO prior to encapsulation by the cover substrate. The method 700 is terminated at step 716.

Various embodiments, as described above, provide a barrier layer capable of preventing permeability of moisture, oxygen, other gases, solvents and volatile organic compounds, which has several advantages. One of the several advantages of some embodiments of this barrier layer is that it is provided with two sets of undulations in two different directions, which allows the barrier layer to stretch or shrink on a macroscopic scale in all directions in its plane by bending of the preformed undulations on a microscopic scale and so enables the barrier layer to withstand thermal stress, mechanical stress, and other kind of mechanical load. Further, since the barrier layer does not crack upon stress, the barrier layer provides improved barrier properties. Besides being used just as a barrier layer in an OLED, the barrier layer of the present invention can also be used as a light extraction element in the OLED. Additionally, the barrier layer of the present invention, being used in a thin film photovoltaic cell barrier layer can also be used as a light trapping layer in the thin film or organic photovoltaic cell.

While the invention has been disclosed in connection with the preferred embodiments shown and described in detail, various modifications and improvements thereon will become readily apparent to those ordinarily skilled in the art. Accordingly, the spirit and scope of the present invention is not to be limited by the foregoing examples, but is to be understood in the broadest sense allowable by law.

All documents referenced herein are hereby incorporated by reference.

What is claimed is:

1. A barrier layer capable of preventing permeation of moisture, oxygen, other gases, solvents and volatile organic compounds, said barrier layer having a surface profile characterized by absence of non-undulating surface, straight lines and sharp edges, said surface profile bending in reaction to at least one of thermal stress, mechanical stress, and load caused by deformation of an adjoining substrate or layer, thereby allowing said barrier layer to stretch and shrink in all directions in a plane along said surface profile of said barrier layer and preventing cracking of said barrier layer.

2. The barrier layer of claim 1, wherein material for said barrier layer is selected from a metal, a semiconductor, a metal oxide, a semiconductor-oxide a metal fluoride, a metal nitride, a semiconductor-nitride, a metal carbide, a semiconductor carbide, a metal carbonitride, a semiconductor carbonitride, a metal oxynitride, a semiconductor oxynitride, a metal boride, a semiconductor boride, a metal oxyboride, a semiconductor oxyboride and combinations thereof.

3. The barrier layer of claim 1, wherein said barrier layer can be used as a light extraction layer in an organic light emitting diode.

4. The barrier layer of claim 1, wherein said barrier layer can be used as a light trapping layer in one of a thin film photovoltaic device and an organic photovoltaic device.

5. The barrier layer of claim 1, wherein said surface profile is produced using a process selected from engraving, milling, spontaneous buckling, interference lithography and other lithographic methods.

6. The barrier layer of claim 1, wherein a thickness of said barrier layer ranges from 5 nm to 500 nm.

7. The barrier layer of claim 1, wherein said barrier layer is applied on said adjoining substrate or layer using a process selected from sputtering, evaporation, chemical vapor deposition, plasma enhanced chemical vapor deposition, sublimation, electron cyclotron resonance-plasma enhanced chemical vapor deposition, physical vapor deposition, atomic layer deposition, and combinations thereof.

8. The barrier layer of claim 1, wherein said surface profile is defined by at least a first set of predefined undulations in a first direction along said surface profile and a second set of predefined undulations in a second direction along said surface profile.

9. The barrier layer of claim 8, wherein said first set of predefined undulations are defined in terms of a first sinusoidal profile and said second set of predefined undulations are defined in terms of a second sinusoidal profile.

10. The barrier layer of claim 9, wherein a wavelength of said first sinusoidal profile and said second sinusoidal profile ranges from 80 nm to 80 micrometers and a wave height ranges from 10 nm to 80 micrometers.

11. The barrier layer of claim 9, wherein at least one of said first sinusoidal profile and said second sinusoidal profile is represented by the equation $z=A \sin x+B \sin y$, further wherein 'A' and 'B' are unequal and 'x' and 'y' are x and y co-ordinates on xy plane of said surface profile respectively.

12. The barrier layer of claim 8, wherein said first direction and said second direction are mutually perpendicular.

13. A barrier layer capable of preventing permeation of moisture, oxygen, other gases, solvents and volatile organic compounds, said barrier layer having a surface profile characterized by absence of non-undulating surface, straight lines and sharp edges, wherein said surface profile is defined by at least a first set of predefined undulations in a first direction along said surface profile and a second set of predefined undulations in a second direction along said surface profile, said surface profile bending in reaction to at least one of thermal stress, mechanical stress, and load caused by deformation of an adjoining substrate or layer, thereby allowing said barrier layer to stretch and shrink in all directions in a plane along said surface profile of said barrier layer and preventing cracking of said barrier layer.

14. The barrier layer of claim 13, wherein said first set of predefined undulations are defined in terms of a first sinusoidal profile and said second set of predefined undulations are defined in terms of a second sinusoidal profile.

15. The barrier layer of claim 14, wherein a wavelength of said first sinusoidal profile and said second sinusoidal profile ranges from 80 nm to 80 micrometers and a wave height ranges from 10 nm to 80 micrometers.

16. The barrier layer of claim 14, wherein at least one of said first sinusoidal profile and said second sinusoidal profile is represented by the equation $z=A \sin x+B \sin y$, further wherein 'A' and 'B' are unequal and 'x' and 'y' are x and y co-ordinates on xy plane of said surface profile respectively.

17. The barrier layer of claim 13, wherein said first direction and said second direction are mutually perpendicular.

18. The barrier layer of claim 13, wherein a thickness of said barrier layer ranges from 5 nm to 500 nm.

19. The barrier layer of claim 13, wherein said barrier layer can be used as a light extraction layer in an organic light emitting diode and said barrier layer can be used as a light trapping layer in one of a thin film photovoltaic device and an organic photovoltaic device.

20. An electronic device comprising:

a. a transparent substrate;

b. a light management layer provided on said transparent substrate;

c. a barrier layer provided on said light management layer, said barrier layer being capable of preventing permeation of moisture, oxygen, other gases, solvents and volatile organic compounds, further wherein said barrier layer having a surface profile characterized by absence of non-undulating surface, straight lines and sharp edges, wherein said surface profile is defined by at least a first set of predefined undulations in a first direction along said surface profile and a second set of predefined undulations in a second direction along said surface profile, said surface profile bending in reaction to at least one of thermal stress, mechanical stress, and load caused by deformation of an adjoining substrate or layer, thereby allowing said barrier layer to stretch and shrink in all directions in a plane along said surface profile of said barrier layer and preventing cracking of said barrier layer a first electrode layer provided on said first side of said disk-shaped substrate;

d. a first electrode provided on said barrier layer;

e. one or more semiconductor layers provided on said first electrode;

f. a second electrode provided on said one or more semiconductor layers; and g. a cover substrate encapsulating said light management layer, said barrier layer, said first electrode, said one or more semiconductor layers and said second electrode between said substrate and said cover substrate.

* * * * *